United States Patent
Schmitt et al.

(10) Patent No.: US 6,232,601 B1
(45) Date of Patent: May 15, 2001

(54) DYNAMICALLY COMPENSATED OBJECTIVE LENS-DETECTION DEVICE AND METHOD

(75) Inventors: Reinhold Schmitt, München; Jürgen Frosien, Riemerling; Stefan Lanio, Erding; Gerald Schonecker, Munich, all of (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/274,665

(22) Filed: Mar. 23, 1999

(30) Foreign Application Priority Data

Apr. 24, 1998 (EP) .................................................. 98107474

(51) Int. Cl.[7] .......................... H01J 37/145; H01J 37/147
(52) U.S. Cl. ........................ 250/310; 250/397; 250/398; 250/396 R; 250/396 ML
(58) Field of Search .................................... 250/397, 398, 250/396 R, 396 ML, 310

(56) References Cited

U.S. PATENT DOCUMENTS 5,412,209 * 5/1995 Otaka et al. ........................ 250/310

* cited by examiner

Primary Examiner—Jack Berman
Assistant Examiner—Nikita Wells
(74) Attorney, Agent, or Firm—Reising, Ethington, Barnes, Kisselle, Learman & McCulloch, P.C.

(57) ABSTRACT

The invention relates to a charged particle beam device and a method for inspecting a specimen, comprising a source for generating a charged particle beam, an objective lens with an optical axis for focussing said charged particle beam on a specimen, which consists of a magnetic lens and a superimposed electrostatic lens having at least two electrodes, deflection means for deflecting said charged particle beam on said specimen and detector means for detecting charged particles released at said specimen. The invention is further characterized by control means co-acting with said deflection means and one of the electrodes of the electrostatic lens for applying a dynamic voltage to said electrode, the amount of the voltage being dependent on the distance of said charged particle beam from said optical axis at the specimen, in order to increase the efficiency of detecting said charged particles released at image areas being located on the specimen with distance from the optical axis.

10 Claims, 3 Drawing Sheets

DYNAMICALLY COMPENSATED OBJECTIVE LENS-DETECTION DEVICE AND METHOD

Figure 1:
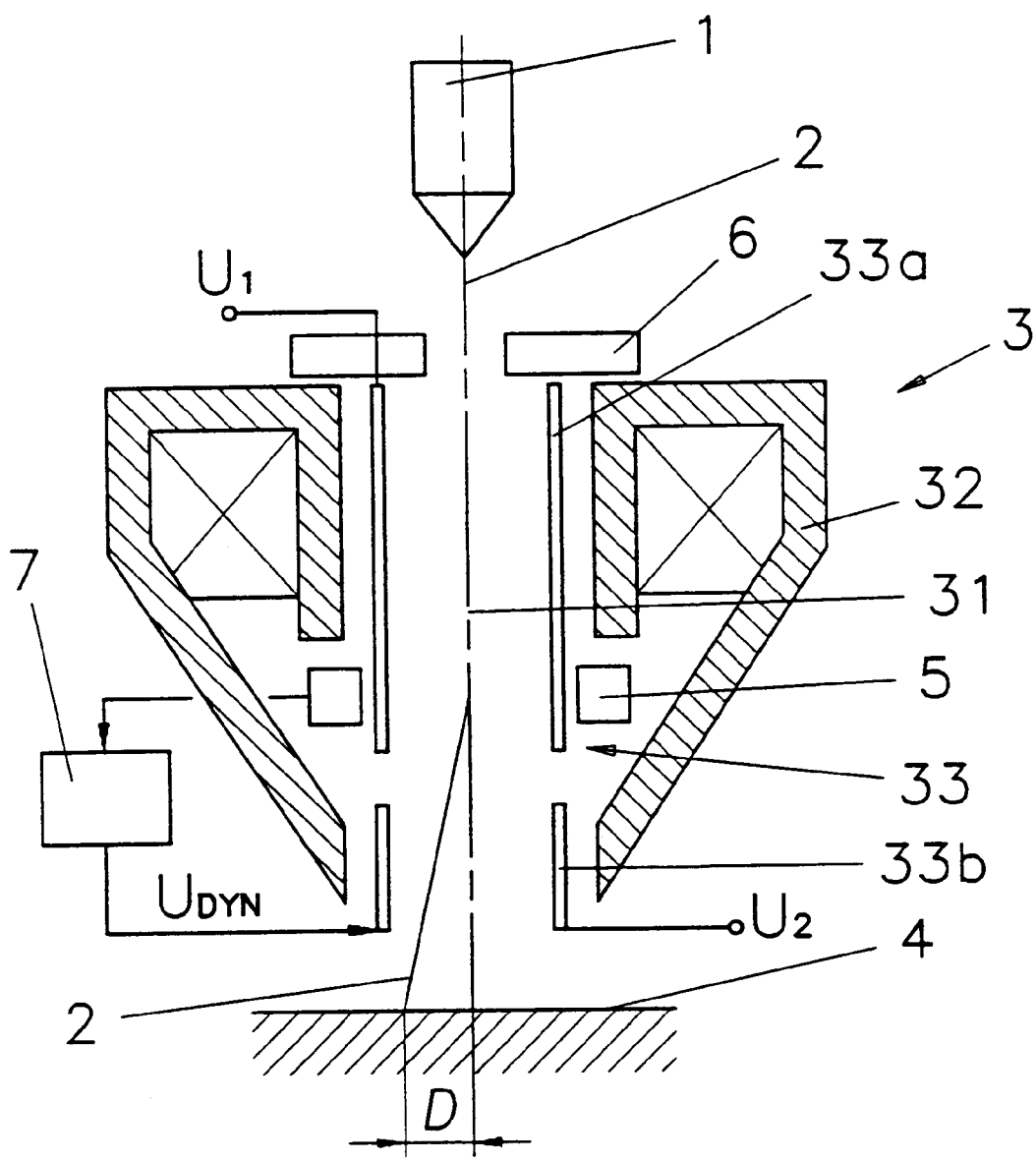

The invention relates to a charged particle beam device according to the preamble of claim 1 and to a method for inspecting a specimen according to the preamble of claim 9.

Charged particle beam devices are known comprising
- a source for generating a charged particle beam,
- an objective lens with an optical axis for focussing said charged particle beam on a specimen which consists of a magnetic lens and a superimposed electrostatic lens having at least two electrodes,
- deflection means for deflecting said charged particle beam on said specimen
- and detector means for detecting charged particles released at said specimen.

By using a combination of a magnetical single pole lens and an electrostatic retarding field lens excellent low axial aberration coefficients and correspondingly high axial resolution can be achieved. However, those lenses have a limited image field, in which uniform image brightness and high optical performance can be achieved.

In secondary electron microscopes the secondary electrons and/or backscattered electrons released by the primary electron beam are detected, whereby preferably in-lens detectors and/or pre-lens detectors are used. Known arrangements are
- off-axial detectors, partially using a beam deflector,
- axial detectors with a rotational symmetry or divided into segments,
- or detectors having means for influencing the released particles.

However, the image quality of these known arrangements becomes worse with increasing image field size.

It is, therefore, an object of this invention to provide a charged particle beam device according to the preamble of claim 1 or a method for inspecting a specimen according to the preamble of claim 9 which has an improved efficiency of detecting charged particles released at image areas being located on the specimen with a distance from the optical axis.

This object is solved by the characterizing features of claims 1 and 9. According to the invention there are control means co-acting with the deflection means and one of the electrodes of the electrostatic lens for applying a dynamic voltage to said electrode, the amount of the voltage being dependent on the distance of said charged particle beam from said optical axis at the specimen.

Further improvements and embodiments of the invention are the subject matter of the subclaims and will be explained in greater detail by means of the description of some embodiments and the drawing.

In the drawing

Figure 2:
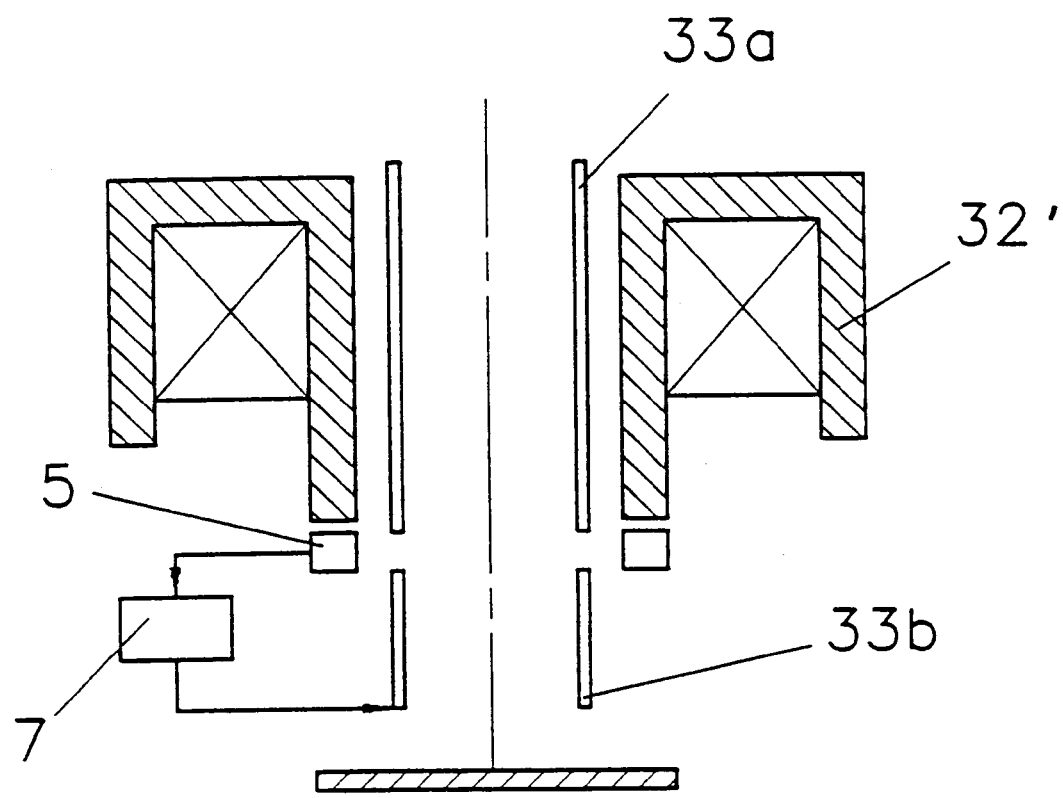
Figure 3:
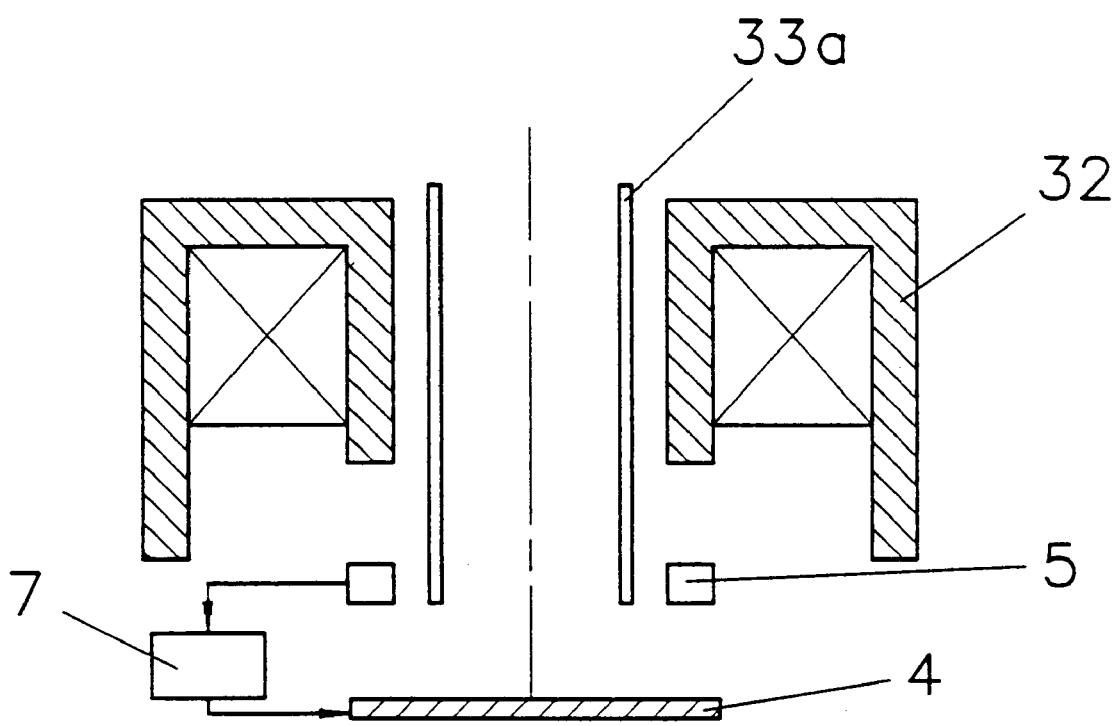

FIG. 1 shows a schematic view of a charged particle beam device according to the present invention, FIG. 2 shows a schematic view of a second embodiment and FIG. 3 a schematic view of a third embodiment.

FIG. 1 shows a charged particle beam device comprising
- a source 1 for generating a charged particle beam 2,
- an objective lens 3 with an optical axis 31 for focussing said charged particle beam 2 on a specimen 4, the objective lens 3 consists of a magnetic lens and a superimposed electrostatic lens 33 having two electrodes 33a, 33b,
- deflection means 5 for deflecting said charged particle beam 2 on said specimen 4
- and detector means 6 for detecting charged particles released at said specimen.

The objective lens 3 is a retarding field lens. Accordingly, electrodes 33a and 33b of the electrostatic lens 33 are supplied with different potentials $U_1$, $U_2$ in such a way that the charged particle beam 2 is decelerated from a first to a lower second energy in the field of the electrostatic lens 33.

Furthermore, there is a control means 7 co-acting with said deflection means 5 and electrode 33b of the electrostatic lens 33 for applying a dynamic voltage $U_{Dyn}$ to electrode 33b. The amount of voltage $U_{Dyn}$ being dependent on the distance D of said charged particle beam from said optical axis 31 at the specimen. The control means 7 receives the information of the distance D from the deflection means 5.

Therefore, the controlled electrode 33b is supplied with voltage $U_2$ and the additional voltage $U_{Dyn}$.

The experiments of the present invention have shown that it is possible to increase significantly the efficiency of detecting said charged particles released at image areas being located on the specimen with distance from the optical axis. In the center of the image field, i.e. in the optical axis, the voltage $U_{Dyn}$ is zero. Its amount increases with increasing distance D from the optical axis. A good first order approximation for the additional voltage $U_{Dyn}$ is that its amount increases quadratically with the distance D from the optical axis. The exact voltage, however, depends on details of lens design and lens geometry. Typical values of voltage $U_{Dyn}$ for image fields of approximately 5 mm may go up to several tens or hundreds of volts. But also higher or lower values are possible.

By applying the additional voltage $U_{Dyn}$ to one of the electrodes of the electrostatic lens, it is possible to act very quickly according to the primary beam position. This additional voltage has a positive influence on the secondary particles released at the specimen because the shading of off-axial image areas is reduced.

This additional voltage has no negative influence on the primary beam performance. Image resolution of offaxial primary beam positions is not reduced but even increased.

While FIG. 1 discloses a conventional pole piece magnetic lens, FIG. 2 shows a single pole magnetic lens 32'. However, all other features, especially control means 7 coacting with deflection means 5 and electrode 33b are identical.

In the case that the electrostatic lens 33 consists of two electrodes 33a, 33b, the additional voltage $U_{Dyn}$ is preferably supplied to the lower electrode (in the direction of the particle beam 2).

In the embodiment according to FIG. 3, the specimen 4 is part of the electrostatic lens and defines the controlled electrode to which the additional voltage $U_{Dyn}$ is preferably supplied.

In the case that the electrostatic lens consists of three electrodes, the additional voltage $U_{Dyn}$ is preferably supplied to the lowest or the center electrode. However, also the other electrodes or the sample can be supplied with the additional voltage.

The deflection means is either formed by a magnetical or electrostatical scan system or a combined electrostatic/magnetical scan system. The deflection means are formed by single stage, double deflection systems or even higher stage systems.

The detector 6 in FIG. 1 is preferably a pre-lens or an in-lens detector. The additional dynamic voltage influences the secondary or backscattered particles released off-axial at the specimen by bending them inside the lens. The escaping bundle of the secondary particles will leave the objective lens more axial and can reach the in-lens or pre-lens detector without being absorbed or attenuated. This effect reduces the brightness shading significantly.

What is claimed is:

1. Charged particle beam device comprising a source (1) for generating a charged particle beam (2), an objective lens (3) with an optical axis (31) for focussing said charged particle beam (2) on a specimen (4), which consists of a magnetic lens (32) and a superimposed electrostatic lens (33) having at least two electrodes (33a, 33b), deflecting means (5) for deflecting said charged particle beam on said specimen (4)

and detector means (6) for detecting charged particles released at said specimen, characterized by control means (7) co-acting with said deflection means (5) and one of the electrodes (33b) of the electrostatic lens (33) for applying a dynamic voltage ($U_{Dyn}$) to said electrode (33b), the amount of said voltage being dependent on the distance (D) of said charged particle beam from said optical axis at the specimen, in order to increase the efficiency of detecting said charged particles released at image areas being located on the specimen with distance from the optical axis.

2. Charged particle beam device according to claim 1, characterized in that the objective lens is a retarding field lens.

3. Charged particle beam device according to claim 1, characterized in that the second electrode (33b) in the direction of the charged particle beam (2) is supplied with the dynamic voltage ($U_{Dyn}$).

4. Charged particle beam device according to claim 1, characterized in that the controlled electrode is formed by the specimen (4).

5. Charged particle beam device according to claim 1, characterized in that the deflection means is formed by a magnetical scan system.

6. Charged particle beam device according to claim 1, characterized in that the deflection means is formed by an electrostatical scan system.

7. Charged particle beam device according to claim 1, characterized in that the deflection means is formed by a combined electrostatic/magnetical scan system.

8. Charged particle beam device according to one of the former claims characterized in that the deflection means has one or more stages.

9. Method for inspecting a specimen comprising the following steps:

generating a charged particle beam (2), focussing said charged particle beam (2) on a specimen with an objective lens with an optical axis consisting of a magnetic lens and a superimposed electrostatic lens having at least two electrodes, deflecting said charged particle beam on said specimen and detecting charged particles released at the specimen, characterized by applying a dynamic voltage ($U_{Dyn}$) to an electrode (33b) of the electrostatic lens, the amount of the voltage depending on the distance (D) of said charged particle beam from the optical axis at the specimen in order to increase the efficiency of detecting said charged particles released at image areas being located on the specimen with distance from the optical axis.

10. Method according to claim 9, characterized in that the dynamic voltage ($U_{Dyn}$) is increased quadratically with the distance (D) of the charged particle beam from the optical axis 31.

* * * * *